US009466347B1

(12) United States Patent
Pasotti et al.

(10) Patent No.: US 9,466,347 B1
(45) Date of Patent: Oct. 11, 2016

(54) ROW DECODER FOR NON-VOLATILE MEMORY DEVICES AND RELATED METHODS

(71) Applicants: STMICROELECTRONICS S.R.L., Agrate Brianza (IT); STMICROELECTRONICS INTERNATIONAL N.V., Amsterdam (NL)

(72) Inventors: Marco Pasotti, Travaco' Siccomario (IT); Vikas Rana, Noida (IN)

(73) Assignees: STMICROELECTRONICS INTERNATIONAL N.V., Amsterdam (NL); STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/971,403

(22) Filed: Dec. 16, 2015

(51) Int. Cl.
*G11C 8/10* (2006.01)
*G11C 13/00* (2006.01)

(52) U.S. Cl.
CPC .............. *G11C 8/10* (2013.01); *G11C 13/004* (2013.01); *G11C 13/0004* (2013.01); *G11C 13/0028* (2013.01)

(58) Field of Classification Search
CPC ... G11C 8/10; G11C 13/0028; G11C 13/004; G11C 13/0004; G11C 16/08; G11C 16/12; G11C 8/08; G11C 11/4085; G11C 5/14; H03K 3/35613
See application file for complete search history.

(56) References Cited

U.S. PATENT DOCUMENTS

| | | | | |
|---|---|---|---|---|
| 6,018,255 A * | 1/2000 | Campardo | ............... | G11C 8/10 326/105 |
| 6,094,073 A | 7/2000 | Campardo et al. | | |
| 6,587,375 B2 * | 7/2003 | Chung | ................... | G11C 16/08 365/185.11 |
| 8,750,051 B1 * | 6/2014 | Hirose | ............... | H03K 3/35613 365/185.11 |
| 8,982,615 B2 | 3/2015 | Conte et al. | | |
| 2008/0106941 A1 * | 5/2008 | Cho | ........................ | G11C 16/12 365/185.13 |
| 2010/0054032 A1 * | 3/2010 | De Sandre | ............... | G11C 8/08 365/163 |
| 2011/0199837 A1 * | 8/2011 | Reohr | ................. | G11C 11/4085 365/189.06 |
| 2012/0155168 A1 * | 6/2012 | Kim | ......................... | G11C 5/14 365/185.03 |
| 2013/0301348 A1 * | 11/2013 | Perroni | ..................... | G11C 8/10 365/163 |

* cited by examiner

*Primary Examiner* — Richard Elms
*Assistant Examiner* — Ajay Ojha
(74) *Attorney, Agent, or Firm* — Allen, Dyer, Doppelt, Milbrath & Gilchrist, P.A.

(57) ABSTRACT

An integrated circuit includes an array of phase-change memory (PCM) cells, a plurality of wordlines coupled to the array of PCM cells, and a row decoder circuit coupled to the plurality of wordlines. The row decoder circuit includes a first low voltage logic gate and a first high voltage level shifter coupled to the first low voltage logic gate. The row decoder circuit also includes a second low voltage logic gate, a second high voltage level shifter coupled to the second low voltage logic gate, and a first low voltage logic circuit coupled to the second low voltage logic gate. In addition, the row decoder circuit includes a second low voltage logic circuit coupled to the second low voltage logic gate, and a low voltage wordline driver having an input coupled to the outputs of the first and second low voltage logic gates, and an output coupled to a selected wordline.

20 Claims, 6 Drawing Sheets

READ VOLTAGE TABLE

| MODE | VX & VXS | VCASC&V CASC | SP_LV &GP_LV | SPN_LV& GPN_LV | SP_HV&G P_HV | PRE | PGATE | WL |
|---|---|---|---|---|---|---|---|---|
| SELECTED (WL) | Vdda | Gnda | Vdda | Vdda | Vdda | Gnda | Gnda | Vdda |
| UNSELECTED (WL) | Vdda | Gnda | Gnda | Vdda | Vdda | Vdda | Gnda | Gnda |

PROGRAM VOLTAGE TABLE

| MODE | VX & VXS | VCASC&V CASC | SP_LV &GP_LV | SPN_LV& GPN_LV | SP_HV&G P_HV | PRE | PGATE | WL |
|---|---|---|---|---|---|---|---|---|
| SELECTED (WL) | VX | VCASC | Gnda | gnda | VCASC | VCASC | VCASC | VX |
| UNSELECTED (WL) | VX | VCASC | Gnda | Vdda | VX | VCASC | VX | Gnda |

*FIG. 9*

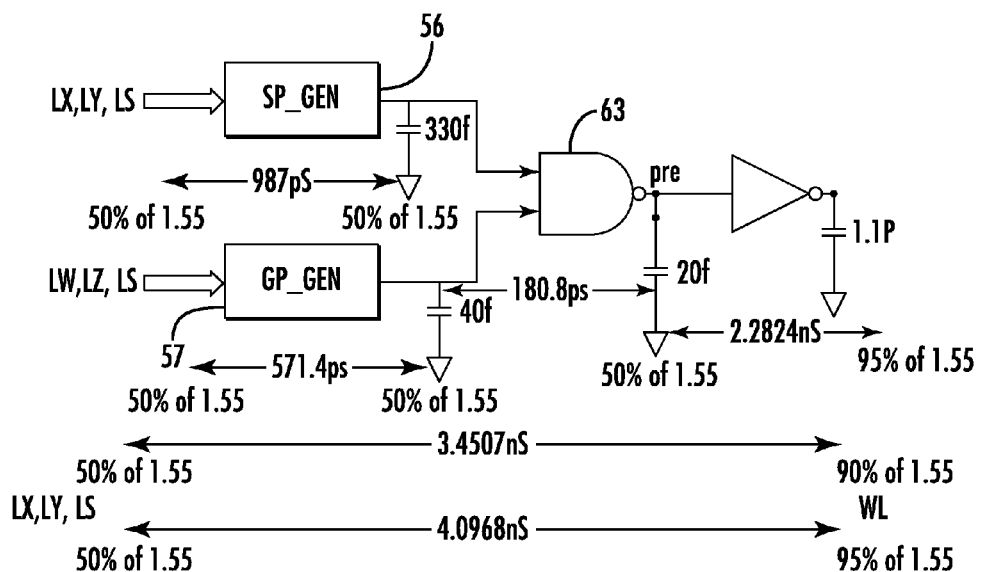

*FIG. 10*

ROW DECODER FOR NON-VOLATILE MEMORY DEVICES AND RELATED METHODS

TECHNICAL FIELD

The present invention relates to the field of memories, and, more particularly, to a row decoder for non-volatile memory devices and related methods.

BACKGROUND

Non-volatile phase-change memories (PCMs) incorporate materials that have the ability to switch between phases having different electrical characteristics. For example, these materials can switch between a disorderly amorphous phase and an orderly crystalline or polycrystalline phase, and the two phases are associated with resistivities of considerably different values, and consequently with a different value of a stored data. For example, the elements of the sixth group of the periodic table, such as tellurium (Te), selenium (Se), or antimony (Sb), called chalcogenides or chalcogenic materials, may advantageously be used for phase change memory cells. In particular, an alloy made of germanium (Ge), antimony (Sb), and tellurium (Te), known as GST (having a chemical composition $Ge_2Sb_2Te_5$), is currently widely used in these memory cells.

Phase changes may be obtained by locally increasing the temperature of the cells of chalcogenic material, through resistive electrodes set in contact with respective regions of chalcogenic material. Access devices, for example metal oxide field effect transistors (MOSFETs), are connected to the heaters and enable selective flow of an electric programming current through a respective heater. This electric current, by the Joule effect, generates the temperatures for a phase change. In particular, when the chalcogenic material is in the amorphous state, with high resistivity (the "RESET" state), a current/voltage pulse (or an appropriate number of current/voltage pulses) of a duration and amplitude is applied to enable the chalcogenic material to cool slowly. Subjected to this treatment, the chalcogenic material changes its state and switches from the high-resistivity state to a low-resistivity state (the "SET" state). When the chalcogenic material is in the SET state, a current/voltage pulse of an appropriate duration and a high amplitude is applied to cause the chalcogenic material to return into the high-resistivity amorphous state.

During reading, the state of the chalcogenic material is detected by applying a voltage that is sufficiently low so as not to cause a phase change, and by reading the value of the current that flows in the memory cell. Since the current is proportional to the conductivity of the chalcogenic material, the state of the material can be determined, and thus the data stored in the memory cell can also be determined. In general, PCMs allow advantages, which include a high scalability and reading speed combined with a low current consumption and a high efficiency.

A non-volatile PCM device generally includes a memory array having memory cells organized in rows (wordlines—WL) and columns (bitlines—BL). Each memory cell includes a storage element and an access element connected in series between a respective bitline BL and a reference potential terminal (for example, ground, GND). In particular, a wordline WL is defined by the set of all the control terminals of the access elements aligned along one and the same row.

The storage element includes a phase change material, for example, a chalcogenide, and is able to store data in the form of resistance levels associated with the various phases assumed by the material. The access element may include an N-channel complementary metal oxide semiconductor (CMOS) transistor having its gate terminal connected to a respective wordline WL, its drain terminal connected to the storage element, and its source terminal connected to the reference potential terminal. The access element is controlled and biased to enable, when selected, the flow of a reading/programming (modify) driving current through the storage element, having an appropriate value during respective reading/programming operations.

A column decoder and a row decoder enable selection based upon address signals received at the input of the memory cells, and in particular of the corresponding wordlines WL and bitlines BL, each time addressed, enabling biasing thereof to appropriate voltage and current values. The column decoder is moreover advantageously configured to define internally two distinct paths towards the bitlines BL of the memory array each time selected. For example, one path is a reading path to selectively create a conductive path between the bitline BL selected and a sense-amplifier stage to compare the current circulating in the addressed memory cell with a reference current to determine the data stored. The second path is a programming path to selectively create a conductive path between the bitline BL selected and a driving stage, which is configured to supply the high currents for generating the changes of state during the programming operations for the Set and Reset states.

In the specific case of PCMs, it is also known that the reading operations, as compared to the programming operations, use lower values for the biasing voltage applied to the wordlines to enable the desired current flow through the storage element, especially when selector transistors of a MOS type are used. For example, a value of 1.2 V may be used during reading and 2.8 V during programming. In this regard, memory devices of a work with two internally available supply voltages. This includes a first supply voltage Vdd having a logic value, generally between 1.08 V and 1.32 V, for example 1.2 V, and a second supply voltage Vcc, of a higher value, generally between 3 V and 3.6 V. Inside the memory device, intermediate voltages are moreover generated, for example by level-shifter stages, that are for the programming operations of the memory cells.

An example of an existing row decoder 20 is now described with reference to FIG. 1, where decoded signals are coupled to an input of an NAND gate 21. The output of the NAND gate 21 is applied to an input of a high voltage inverter 23 through an NMOS switch 22. The output of the inverter 23 is provided to the input of the inverter as feed-back through a PMOS switch 24 to force the input of the inverter 23 to a full positive voltage and to avoid static current consumption through the inverter. In addition, the output of the inverter is applied to an input of wordline WL driver circuitry, which further drives the wordline WLs in a memory array.

An example of an existing pre-decoder stage 30 is now described with reference to FIG. 2, which includes digital logic 31 and two level shifters 32, 33 that are used to translate low voltage to high voltage signals.

An existing row decoder 40 is explained with reference to FIG. 3. For example, pre-decoding stages include high voltage level shifters 32, 33 and high voltage logic 41, 42. The output of the pre-decoding stage is applied to the input of a high voltage NAND gate 43 and which further drives the high voltage wordline WL driver 44. In particular, the circuitry 40 includes high voltage transistors because high voltage is passed on to the wordline WL in the programming operation.

Due to the use of high voltage transistors in the row decoder (including pre-decoder and wordline WL driver), fast charging of the wordlines WLs may be impacted due to lower transconductance of the high voltage transistors. Accordingly, the read operation access timings may also be impacted. In addition, high voltage transistors are larger than low voltage transistors and use more area. Although the read operation is performed at low voltages, the high voltage level shifters are in the wordlines WLs charging path resulting in switching in the level shifters during the read operation. Accordingly, this results in more power consumption.

SUMMARY

An integrated circuit includes an array of phase-change memory (PCM) cells, a plurality of wordlines coupled to the array of PCM cells, and a row decoder circuit coupled to the plurality of wordlines. The row decoder circuit includes a first low voltage logic gate, and a first high voltage level shifter having an output coupled to an input of the first low voltage logic gate, where the high voltage being greater than the low voltage. In addition, the row decoder circuit includes a second low voltage logic gate, a second high voltage level shifter having an output coupled to an input of the second low voltage logic gate, and a first low voltage logic circuit having an output coupled to the input of the second low voltage logic gate. In addition, the row decoder circuit includes a second low voltage logic circuit having an output coupled to the input of the second low voltage logic gate, and a low voltage wordline driver having an input coupled to the outputs of the first and second low voltage logic gates and an output coupled to a selected wordline of the plurality of wordlines.

In another embodiment, a method using a row decoder circuit coupled to an array of phase-change memory cells is disclosed. The row decoder circuit includes a first pre-decoder stage and a second pre-decoder stage, each having a high voltage level shifter and a low voltage logic circuit, respectively, the high voltage level shifters defining a high voltage path during a modify operation and the low voltage logic circuits defining a low voltage path during a read operation, and outputs of the first and second pre-decoder stages coupled to first and second low voltage logic gates having outputs coupled to a wordline driver. The method includes forcing each of the high voltage level shifters to a known state during the read operation to activate the low voltage path, forcing each of the low voltage logic circuits to a known state during the modify operation to activate the high voltage path, applying output of the first and second pre-decoder stages to the first and second low voltage logic gates, and driving the wordline driver with outputs of the first and second low voltage logic gates.

BRIEF DESCRIPTION OF THE DRAWINGS

FIG. 9 is a table of voltages at different nodes of the row decoder during the read operation and the modify operation in accordance with the invention;

FIG. 10 is a representation of proposed timing budgets for pre-decoder stages and a WL driver of the row decoder in accordance with the invention.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
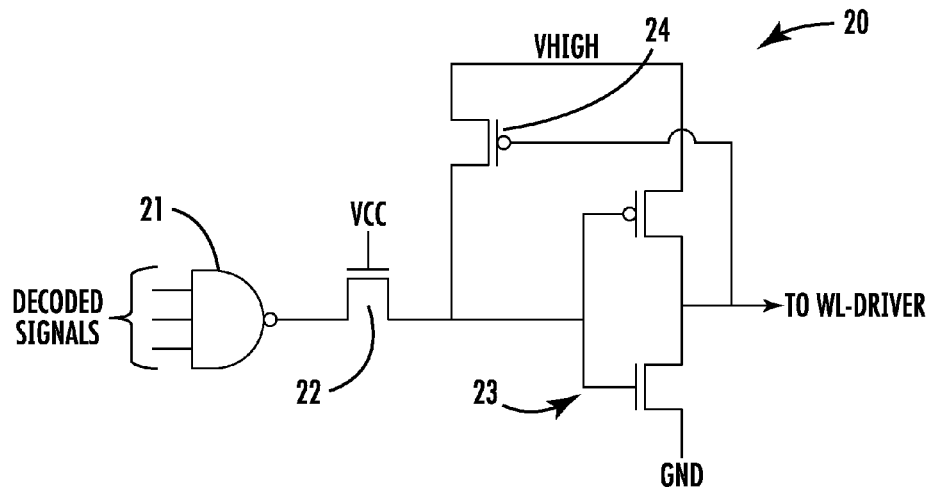
FIG. 1 is a schematic circuit diagram of a portion of a non-volatile memory device, in particular of a PCM type, and of a corresponding prior art row decoder.
Figure 2:
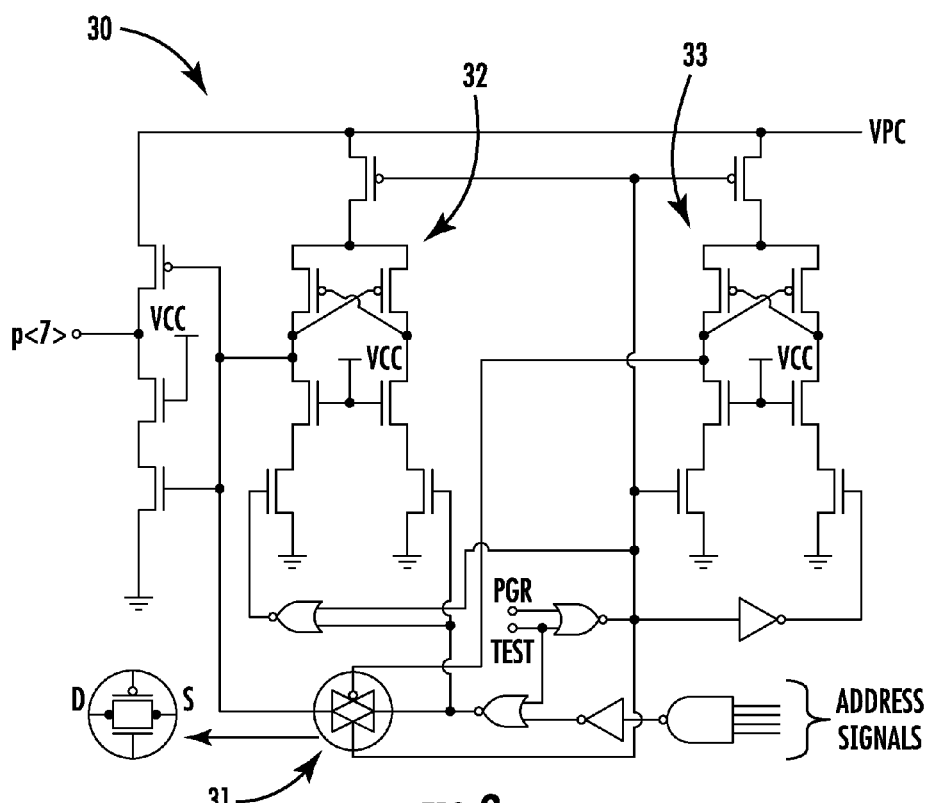
FIG. 2 is a schematic circuit diagram of a prior art pre-decoder stage.
Figure 3:
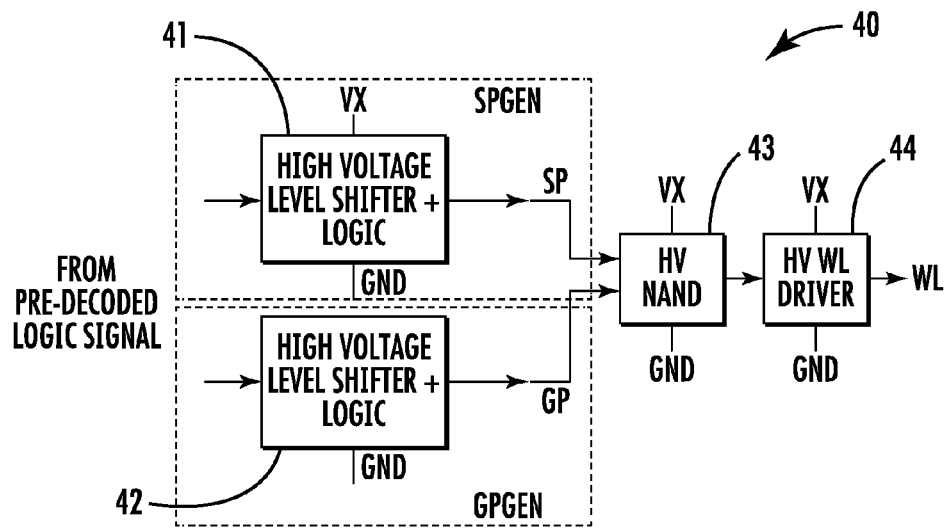
FIG. 3 is a block diagram of a row decoder as in the prior art.
Figure 4:
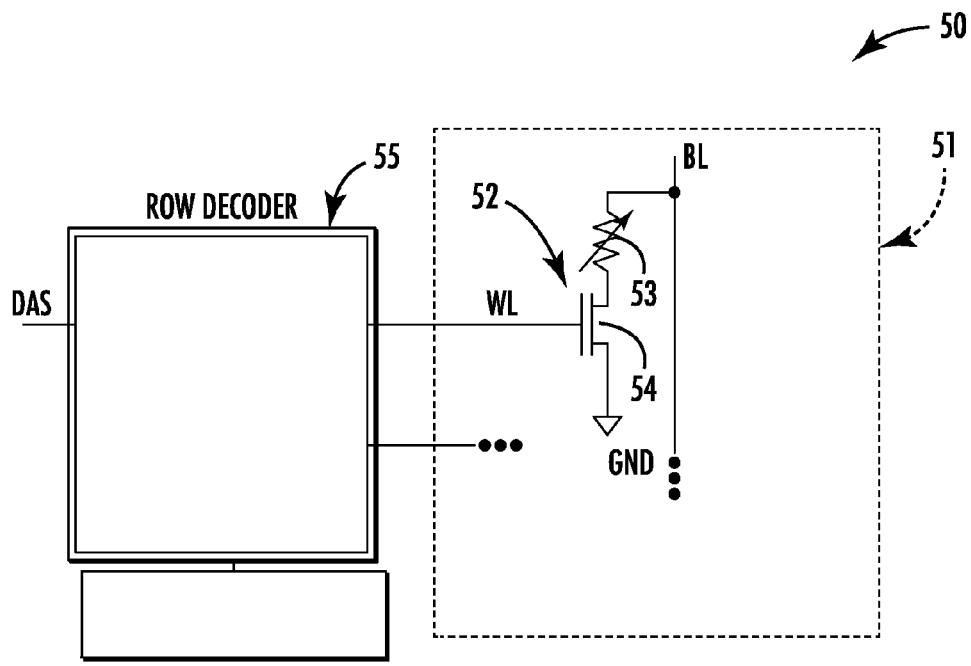
FIG. 4 is a schematic circuit diagram of a portion of a non-volatile memory device, in particular of a PCM type in accordance with the invention.

Referring initially to FIG. 4, a non-volatile memory device, in particular of a PCM type, designated as a whole by the reference number 50, is now described. In particular, the non-volatile memory device 50 comprises a memory array 51, of a plurality of memory cells 52, arranged according to array wordlines WL and array bitlines BL, as is known by those skilled in the art. The memory cells 52 are identical to one another and comprise a phase-change element 53 and a selector element 54, operatively coupled thereto. The phase-change element 53 includes a phase-change material (for example, a chalcogenide), and is able to store data in the form of resistance levels associated to the various phases assumed by the phase-change material. The selector element 54, in the illustrated embodiment, is an NMOS transistor having its gate terminal connected to the array wordline WL, its drain terminal connected to the phase-change element, and its source terminal connected to a reference potential (in particular ground, GND). The selector element 54 is controlled so as to enable, when selected, passage of a reading/programming current through the phase-change element 53 during respective reading/programming operations.

The memory device 50 further comprises a row decoder 55, to select the array wordline WL corresponding to the memory cell 52 to be addressed, and a column decoder (not shown) to select the array bitline BL corresponding to the memory cell to be addressed.

The row decoder 55 receives decoded address signals, generated in a known way that is not illustrated in detail, and biasing signals. The row decoder 55 is configured so as to address a given array wordline WL, i.e., so as to select, on the basis of the decoded address signals, the given array wordline WL, and so as to enable biasing thereof at a given electrical level.

Figure 5:
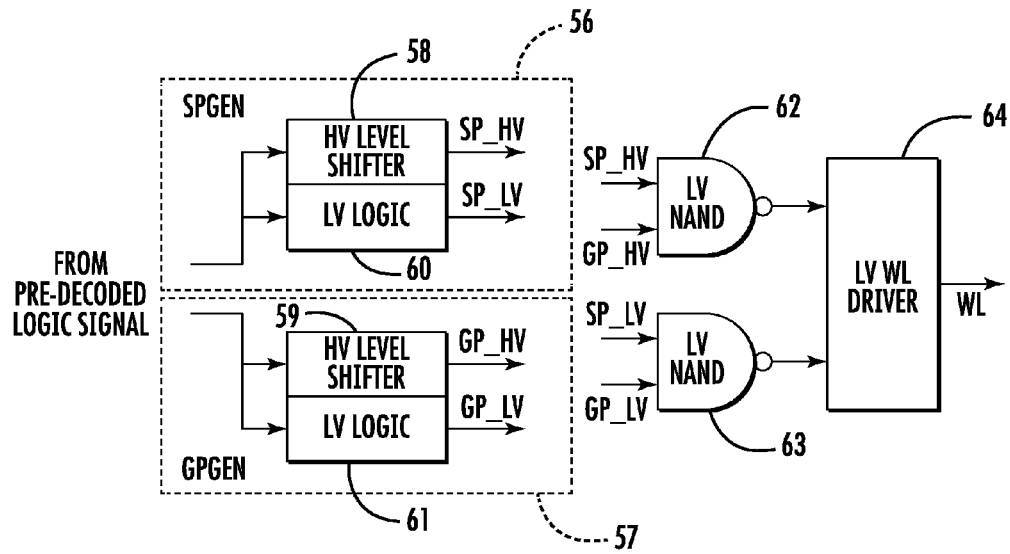
FIG. 5 is a block diagram of a row decoder in accordance with an embodiment of the invention.

Referring now to FIG. 5, a block diagram of the row decoder 55 is now described. The row decoder 55 includes pre-decoder stages SPGEN 56 and GPGEN 57, which each may include a high voltage level shifter 58 and 59, respectively. The high voltage level shifters 58 and 59 may each comprise a plurality of high voltage transistors. In addition, pre-decoder stages SPGEN 56 and GPGEN 57 each include logic circuitry LV logic 60 and 61, respectively. The high voltage level shifters 58 and 59 are used during modify operation of the memory. The low voltage path is used during a read operation.

During a read operation, the high voltage level shifters 58 and 59 are forced to a known state and output of the pre-decoding stages SPGEN 56 and GPGEN 57 are applied to low voltage NAND gates 62 and 63, respectively. The outputs of the NAND gates 62 and 63 drive the gate of a WL driver 64. The WL driver 64 also comprises low voltage transistors. The NAND gate 62 receives signals GP_HV and SP_HV from the high voltage level shifters 58 and 59, respectively, and provides signal PGATE_HV at its output. The NAND gate 63 receives signals GP_LV and SP_LV from the stages SPGEN 56 and GPGEN 57, respectively, and provides signal PRE at its output. Accordingly, the output of the pre-decoding stages SPGEN 56 and GPGEN 57 is generated and used in such a way that reliability issues are reduced in the low voltage circuitry during a modify or programming operation, which is performed using high voltages.

Figure 6:
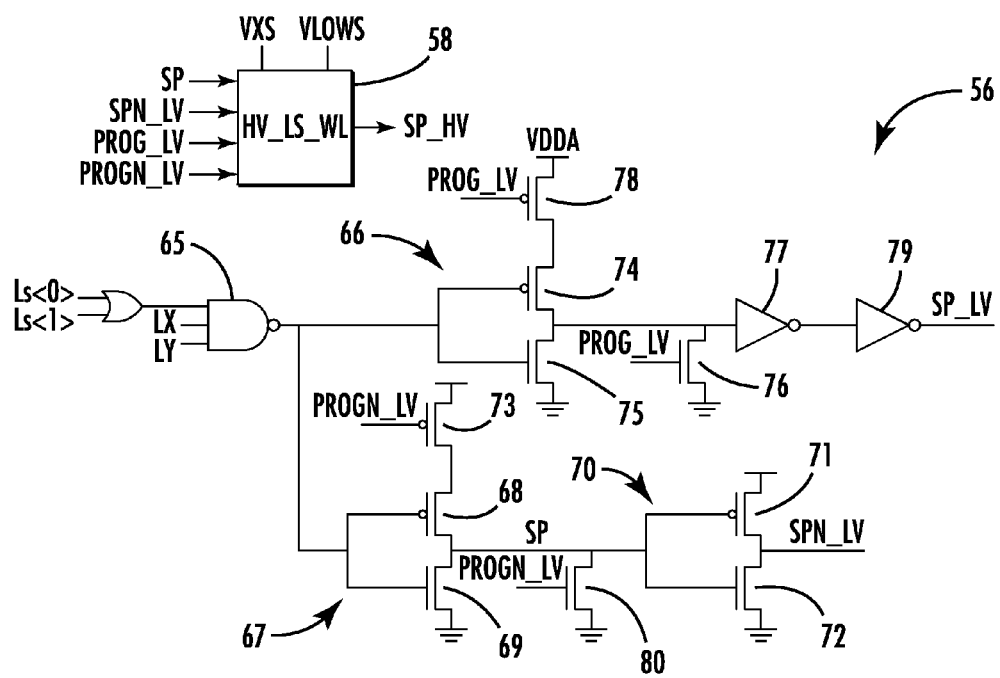
FIG. 6 is a schematic circuit diagram of a SPGEN stage used as a pre-decoder in accordance with an embodiment of the invention.

Referring now to FIG. 6, a schematic circuit diagram of the pre-decoding stage SPGEN 56 is now described, which comprises the high voltage level shifter 58 having high voltage transistors and low voltage logic. The final driver strength is maintained depending upon the capacitive load. The high voltage level shifter 58 receives signals SP, SPN_LV, PROG_LV, and PROGN_LV at its input, and generates signal SP_HV at its output.

The pre-decoding stage SPGEN 56 comprises a NAND gate 65, which receives pre-decoded logic signals on its input and having its output coupled to the inputs of inverter 66 and inverter 67. The inverter 67 is formed by a PMOS transistor 68 and by a NMOS transistor 69, which are both low voltage transistors (i.e., operating with voltages not higher that the first supply voltage) and have their gate terminals coupled together to the output of the NAND gate 65 and their drain terminals coupled together and to the input of inverter 70 and to the drain terminal of NMOS transistor 80. The source terminals of both NMOS transistors 69 and 80 are coupled to a reference voltage. The gate terminal of transistor 80 is coupled to PROGN_LV. Inverter 70 is formed of PMOS transistor 71 and NMOS transistor 72, and have their gate terminals coupled together to the output of the inverter 67 and their drain terminals coupled together and to SPN_LV. PMOS transistor 68 has its source terminal coupled to the drain terminal of PMOS transistor 73, which has its source terminal coupled to Vdda and its gate to PROGN_LV.

Similarly, inverter 66 is formed by a PMOS transistor 74 and NMOS transistor 75, and have their gate terminals coupled together to the output of NAND gate 65 and their drain terminals coupled together and to input of NOT gate 77 and drain terminal of NMOS transistor 76. The source terminal of NMOS transistor 76 is coupled to the reference voltage and its gate is coupled to PROG_LV. The output of the NOT gate 77 is coupled to an input of NOT gate 79, which has an output of SP_LV. PMOS transistor 74 has its source terminal coupled to the drain terminal of PMOS transistor 78, which has its source terminal coupled to Vdda and its gate to PROG_LV. The source terminal of transistor 75 is coupled to ground.

Figure 7:
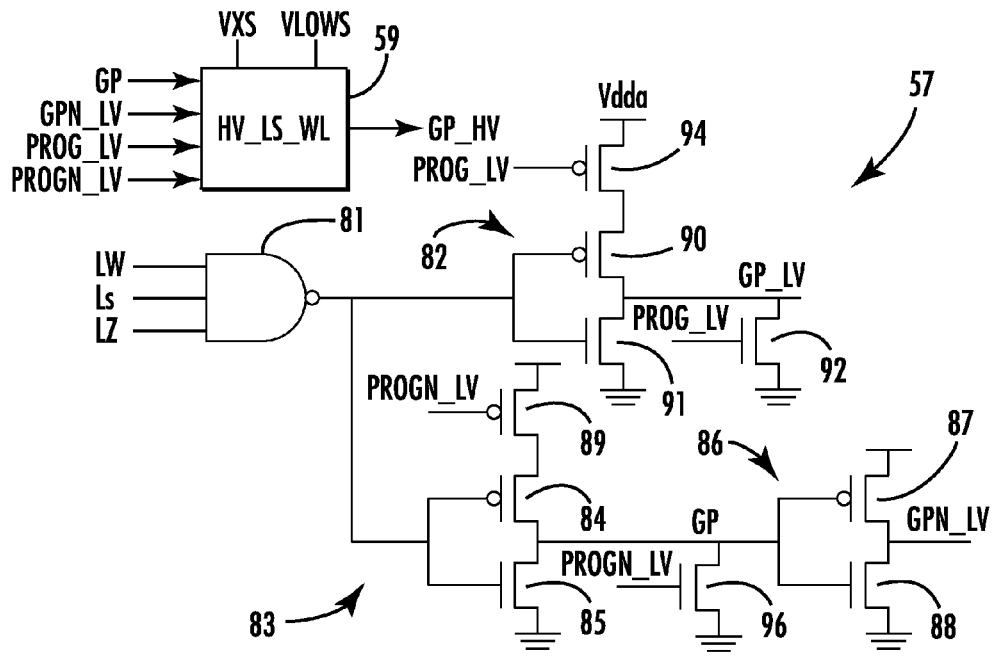
FIG. 7 is a schematic circuit diagram of a GPGEN stage used a pre-decoder in accordance with an embodiment of the invention.

Referring now to FIG. 7, a schematic circuit diagram of the pre-decoding stage GPGEN 57 is now described, which is similar to SPGEN 56 but there is a difference in final driver strength, which is decided based on capacitive load to be charged. GPGEN 57 includes a high voltage level shifter 59 having high voltage transistors and low voltage logic. The high voltage level shifter 59 receives signals GP, GPN_LV, PROG_LV, and PROGN_LV at its input, and generates signal GP_HV at its output.

The pre-decoding stage GPGEN 57 comprises an NAND gate 81, which receives pre-decoded logic signals on its input and having its output coupled to the inputs of inverter 82 and inverter 83. The inverter 83 is formed by a PMOS transistor 84 and by a NMOS transistor 85, which are both low voltage transistors and have their gate terminals coupled together to the output of the NAND gate 81 and their drain terminals coupled together and to the input of inverter 86 and to the drain terminal of NMOS transistor 96. The source terminals of both NMOS transistors 85 and 96 are coupled to a reference voltage. The gate terminal of transistor 96 is coupled to PROGN_LV.

Inverter 86 is formed of PMOS transistor 87 and NMOS transistor 88, and have their gate terminals coupled together to the output of the inverter 83 and their drain terminals coupled together and to GPN_LV. PMOS transistor 84 has its source terminal coupled to the drain terminal of PMOS transistor 89, which has its source terminal coupled to Vdda and its gate to PROGN_LV.

Inverter 82 is formed by a PMOS transistor 90 and NMOS transistor 91, and have their gate terminals coupled together to the output of NAND gate 81 and their drain terminals coupled together and to GP_LV and drain terminal of NMOS transistor 92. The source terminal of NMOS transistor 92 is coupled to the reference voltage and its gate is coupled to PROG_LV. PMOS transistor 90 has its source terminal coupled to the drain terminal of PMOS transistor 94, which has its source terminal coupled to Vdda and its gate to PROG_LV. The source terminal of transistor 91 is coupled to the reference voltage.

Figure 8:
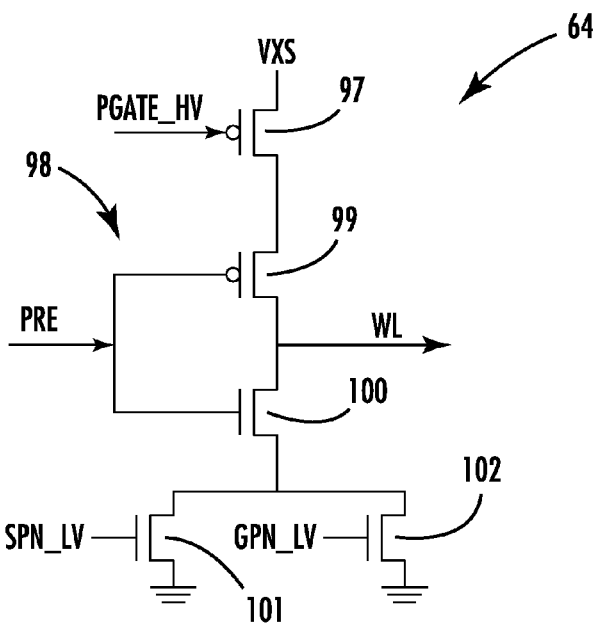
FIG. 8 is a schematic circuit diagram of a wordline WL driver in accordance with an embodiment of the invention.

Referring now to FIG. 8, a schematic circuit diagram of the WL driver 64 is now described. As described above, the NAND gates 62 and 63 and the WL driver 64 comprise low voltage transistors. The NAND gate 62 provides signal PGATE_HV at its output coupled to the gate of PMOS transistor 97. The NAND gate 63 provides signal PRE at its output coupled to the input of inverter 98. The inverter 98 is formed by a PMOS transistor 99 and by a NMOS transistor 100, which are both low voltage transistors and have their gate terminals coupled together to the output of the NAND gate 63 and their drain terminals coupled together and to the wordline WL. The PMOS transistor 97 has its source terminal coupled to VXS and its drain terminal coupled to the source terminal of PMOS transistor 99.

The source terminal of NMOS transistor 100 is coupled to the drain terminals of NMOS transistors 101 and 102, which both have their source terminals coupled to reference voltage. The gate of the NMOS transistor 101 is coupled to the output of inverter 70 of SPGEN 56 and receives signal SPN_LV. The gate of NMOS transistor 102 is coupled to the output of inverter 86 of GPGEN 57 and receives signal GPN_LV.

As illustrated in the drawings, the low voltage path and the high voltage paths are segregated for the read operation and the modify operation, respectively.

A method of using a row decoder includes that during the read operation, the low voltage path is activated so PLATE_HV signal (shown in FIG. 8) is clamped to the reference voltage and the PRE signal is switched to change the gate of the WL driver 64 and to select/de-select the wordline WL. Similarly, during the modify operation, the PRE signal is fixed to a voltage (i.e., cascade voltage) and the PLATE_HV signal is switched to select/deselect the wordline WL. The VXS signal goes to Vdd level during the memory read operation and goes to high voltage during the modify operation.

A table of the voltages at different nodes during the read operation and the modify operation are shown in FIG. 9. FIG. 10 is a representation of proposed timing budgets for the pre-decoder stages SPGEN 56 and GPGEN 57, and the WL driver 64 in a particular scenario. The timing is taken for 90% of the WL charging and 95% of WL charging.

Figure 11:
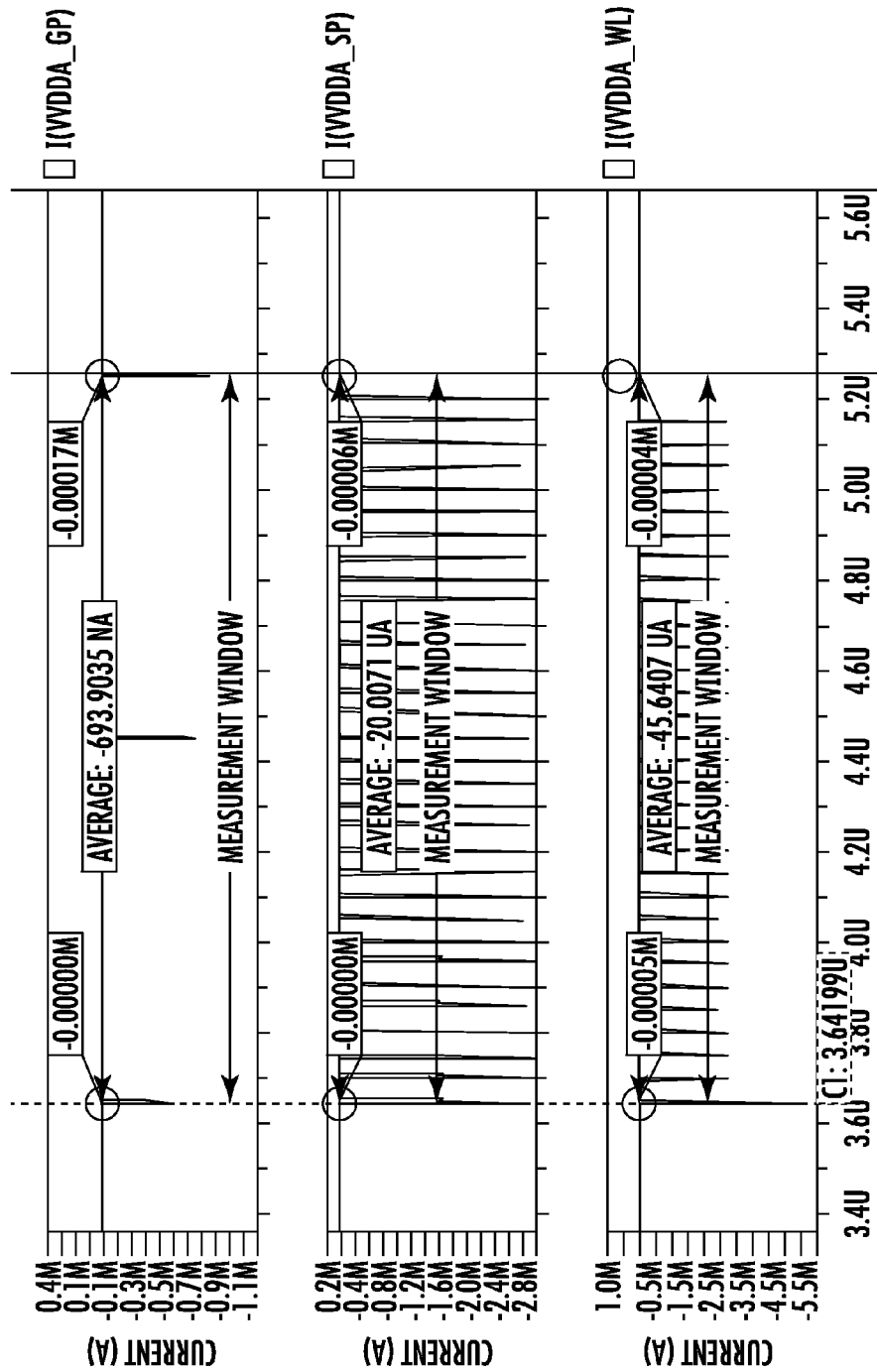
FIG. 11 is simulation results for power consumption of the row decoder in accordance with the invention.

FIG. 11 shows the simulation results for the power consumption of the row decoder 55, including the total current consumed during multiple read operations. For example, in FIG. 11, a total of thirty-two (32) sequential read operations are illustrated. IVVDDA_GP represents the current consumed by the GPGEN circuitry 57, IVVIDDA_SP represents the current consumed by the SPGEN circuitry 56, and IVVDDA_WL represents the current consumed by the WL driver circuitry 64 during the thirty-two (32) sequential read operations. There is decreased static current consumption from the row-driver and pre-driver stages so the average of the thirty-two (32) sequential read operations accounts for the dynamic current consumption. As shown in FIG. 11, approximately 66% of the current is used to charge the WL driver 64, which indicates maximum capacitance.

From what has been described and illustrated previously, the advantages that the row decoder according to the present disclosure enables are evident. In particular, the approaches described enable use of the peculiarities of a phase-change memory array, separating the row-decoding paths in reading and programming, thereby reducing the static power used for row selection, and simultaneously reducing the dynamic power and improving the performance during reading operations. For example, the row decoder described has specific advantages that include less power consumption as a result of the low voltage devices used in the architecture and also because the high voltage level shifters are not switching during the read operation. In addition, the row decoder is faster than existing row decoders because during the read operation only the low voltage transistors are coming in the WL charging path.

Since the transconductance of the low voltage transistors is very high compared to the high voltage transistors, the WL charging time is much less. The row decoder also has a smaller area occupation for local row decoding as a result of the use of low voltage transistors in the WL driver. Due to the separate high voltage and low voltages paths, each has different design constraints and thus the size may be reduced according to the respective precise constraints, which requires less area. In addition, there is no voltage stress across the junctions used in the complete row driver.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. An integrated circuit comprising:
    an array of phase-change memory (PCM) cells;
    a plurality of wordlines coupled to the array of PCM cells; and
    a row decoder circuit coupled to the plurality of wordlines, the row decoder circuit comprising
        a first low voltage logic gate,
        a first high voltage level shifter having an output coupled to an input of the first low voltage logic gate, the high voltage being greater than the low voltage,
        a second low voltage logic gate,
        a second high voltage level shifter having an output coupled to an input of the second low voltage logic gate,
        a first low voltage logic circuit having an output coupled to the input of the second low voltage logic gate,
        a second low voltage logic circuit having an output coupled to the input of the second low voltage logic gate, and
        a low voltage wordline driver having an input coupled to the outputs of the first and second low voltage logic gates, and an output coupled to a selected wordline of the plurality of wordlines.

2. The integrated circuit of claim 1, wherein the first and second low voltage logic gates each comprises a NAND gate.

3. The integrated circuit of claim 1, wherein the row decoder circuit is configured to enable alternatively a first low voltage path and a second high voltage path, respectively, during a reading operation and a modify operation.

4. The integrated circuit of claim 1, wherein the first low voltage circuit comprises:
    a third low voltage logic gate configured to receive pre-decoded logic signals;
    a first inverter having an input coupled to an output of the third low voltage logic gate;
    a second inverter coupled to an output of the first inverter and having an output coupled to the wordline driver; and
    a third inverter having an input coupled to the output of the third low voltage logic gate and having an output coupled to the input of the second low voltage logic gate.

5. The integrated of claim 1, wherein the second low voltage circuit comprises:
    a fourth low voltage logic gate configured to receive the pre-decoded logic signals;
    a fourth inverter having an input coupled to an output of the fourth low voltage logic gate;
    a fifth inverter coupled to an output of the fourth inverter and having an output coupled to the input of the second low voltage logic gate; and
    a sixth inverter having an input coupled to the output of the output of the fourth low voltage logic gate and having an output coupled to the wordline driver.

6. The integrated circuit of claim 5, wherein the first inverter comprises a first PMOS transistor and a first NMOS transistor, having gate terminals coupled together to receive pre-decoded logic signals and their drain terminals coupled together to an input of the second inverter.

7. The integrated circuit of claim 6, wherein the second inverter comprises a second PMOS transistor and a third NMOS transistor, having gate terminals coupled together to the output of the first inverter and their drain terminals coupled together.

8. The integrated circuit of claim 7, wherein the third inverter comprises a fourth PMOS transistor, and a fourth NMOS transistor having gate terminals coupled together to the output of the third low voltage logic gate, and their drain terminals coupled together.

9. The integrated circuit of claim 5, wherein the fourth inverter comprises a fifth PMOS transistor and a sixth NMOS transistor, having gate terminals coupled together to receive pre-decoded logic signals and their drain terminals coupled together to an input of the fifth inverter.

10. The integrated circuit of claim 9, wherein the fifth inverter comprises a sixth PMOS transistor and an eighth NMOS transistor, having gate terminals coupled together to the output of the fourth inverter.

11. The integrated circuit of claim 10,
wherein the sixth inverter comprises an eighth PMOS transistor, and a ninth NMOS transistor, having gate terminals coupled together to the output of the fourth low voltage logic gate, and their drain terminals coupled together.

12. A row decoder circuit for a phase-change non-volatile memory device comprising a plurality of phase-change memory cells and a plurality of wordlines coupled thereto, the row decoder circuit comprising:
a first low voltage logic gate;
a first high voltage level shifter having an output coupled to an input of the first low voltage logic gate, the high voltage being greater than the low voltage;
a second low voltage logic gate;
a second high voltage level shifter having an output coupled to an input of the second low voltage logic gate;
a first low voltage logic circuit having an output coupled to the input of the second low voltage logic gate;
a second low voltage logic circuit having an output coupled to the input of the second low voltage logic gate; and
a wordline driver having an input coupled to the outputs of the first and second low voltage logic gates, and an output coupled to a selected wordline of the plurality of wordlines.

13. The row decoder circuit of claim 12, wherein the first and second low voltage logic gates each comprises a NAND gate.

14. The row decoder circuit of claim 12, wherein the row decoder circuit is configured to enable alternatively a first low voltage path and a second high voltage path, respectively, during a reading operation and a modify operation.

15. The row decoder according to claim 12, wherein the first low voltage circuit comprises:
a third low voltage logic gate configured to receive pre-decoded logic signals;
a first inverter having an input coupled to an output of the third low voltage logic gate;
a second inverter coupled to an output of the first inverter and having an output coupled to the input of the second low voltage logic gate; and
a third inverter having an input coupled to the output of the third low voltage logic gate and having an output coupled to the wordline driver.

16. The row decoder according to claim 12, wherein the second low voltage circuit comprises:
a fourth low voltage logic gate configured to receive the pre-decoded logic signals;
a fourth inverter having an input coupled to an output of the fourth low voltage logic gate;
a fifth inverter coupled to an output of the fourth inverter and having an output coupled to the input of the second low voltage logic gate; and
a sixth inverter having an input coupled to the output of the output of the fourth low voltage logic gate and having an output coupled to the wordline driver.

17. A method of using a row decoder circuit coupled to an array of phase-change memory cells, the row decoder circuit comprising a first pre-decoder stage and a second pre-decoder stage, each having a high voltage level shifter and a low voltage logic circuit, respectively, the high voltage level shifters defining a high voltage path during a modify operation and the low voltage logic circuits defining a low voltage path during a read operation, and outputs of the first and second pre-decoder stages coupled to first and second low voltage logic gates having outputs coupled to a wordline driver, the method comprising:
forcing each of the high voltage level shifters to a known state during the read operation to activate the high voltage path;
forcing each of the low voltage logic circuits to the known state during the modify operation to activate the low voltage path;
applying output of the first and second pre-decoder stages to the first and second low voltage logic gates; and
driving the wordline driver with outputs of the first and second low voltage logic gates.

18. The method of claim 17, wherein the first and second low voltage logic gates each comprises a NAND gate.

19. The method of claim 17, wherein the wordline driver and the first and second low voltage logic gates comprise low voltage transistors.

20. The method of claim 17, further comprising alternatively enabling the low voltage path and the high voltage path, respectively, during the reading operation and the modify operation.

* * * * *